United States Patent [19]

Tu

[11] Patent Number: 6,030,456
[45] Date of Patent: Feb. 29, 2000

[54] INSTALLATION TO SUPPLY GAS

[75] Inventor: An-Chun Tu, Taipei, Taiwan

[73] Assignee: Winbond Electronics Corp., Hsinchu, Taiwan

[21] Appl. No.: 09/191,934

[22] Filed: Nov. 13, 1998

[30] Foreign Application Priority Data

Jul. 28, 1998 [TW] Taiwan ................................. 87112283

[51] Int. Cl.$^7$ ................................................. C23C 16/00
[52] U.S. Cl. ...................... 118/708; 118/715; 118/723 E; 156/345
[58] Field of Search ................................. 118/715, 723 E, 118/708; 156/345

[56] References Cited

U.S. PATENT DOCUMENTS 5,552,017  9/1996  Jang ........................................ 118/715

Primary Examiner—Richard Bueker
Attorney, Agent, or Firm—Jiawei Huang; J.C. Patents

[57] ABSTRACT

An installation can adjust gas supply in a reaction chamber according to the conditions in the reaction chamber. The installation comprises sensors, a gas-supplying panel and a driving device. The sensors are located in the reaction chamber to sense the conditions in the reaction chamber. The gas-supplying panel has a plurality of apertures, which are asymmetrically located, through which apertures gas is supplied. The driving device, coupled to the sensors and the gas-supplying panel, drives the gas-supplying panel to respond to the conditions sensed by the sensors, in which the gas-supplying panel can adjust the positions of the gas supplied through the apertures.

10 Claims, 2 Drawing Sheets

INSTALLATION TO SUPPLY GAS

CROSS-REFERENCE TO RELATED APPLICATION

This application claims the priority benefit of Taiwan application Ser. No. 87112283, filed Jul. 28, 1998, the full disclosure of which is incorporated herein by reference.

BACKGROUND OF THE INVENTION

1. Field of Invention

The present invention relates to an installation for supplying gas in a semiconductor manufacturing reaction chamber. More particularly, the present invention relates to an installation for adjusting gas supply in a semiconductor manufacturing reaction chamber according to an environmental condition in the reaction chamber.

2. Description of Related Art

Integrated circuits are manufactured with sub-micron dimensions while the size of wafers from which the circuits are produced is increased. In this situation, it is important to control the uniformity of reacting plasma, which is closely related to the uniformity and the microloading effect of the wafer. The microloading effect is a condition in which different etching rates and depositing rates occur while etching or forming a thin film on the wafer due to the exposed areas of a pattern. Provision of a uniform gas flow from a gas source is an important issue in the development of semiconductor technique.

FIG. 1 shows a schematic, cross-sectional view of a conventional installation to supply gas in a reaction chamber 100. The reaction chamber 100 is installed with a gas-supplying panel 110 and a negative electrode 115. The gas-supplying panel 110 is installed under the top cover 118 of the reaction chamber 100. A wafer 120, which is to be reacted, is placed on the negative electrode 115. The reaction chamber 100 possesses an outlet 130, which is coupled to a pump 150 through a valve 140. When the pump 150 is operating, gas in the reaction chamber 100 is drawn into the pump 150, by which action a vacuum is maintained in the reaction chamber 100. Furthermore, reacting gases are introduced into the reaction chamber 100 through the gas-supplying panel 110 to react with the wafer 120 deposit a thin film or etch the wafer. Hereinafter the function of the gas-supplying panel 110 is introduced in detail, and is further illustrated in FIG. 2.

FIG. 2 shows a schematic, top view of the gas-supplying panel 110 as shown in FIG. 1. The gas-supplying panel 110 has a plurality of symmetric apertures 112 and is circular. The apertures 112 are symmetrically arranged with respect to the center point of the gas-supplying panel 110. Reacting gases can be introduced into the reaction chamber 100 through the apertures 112 of the gas-supplying panel 110 that is installed under the top cover 118 of the reaction chamber 100. Because the apertures 112 are located symmetrically in the gas-supplying panel 110, the reacting gases are uniformly introduced and distributed into the reaction chamber 100. However, the interior of the reaction chamber 100 is asymmetrical due to installations in the chamber, and thus the gas flow of the gases introduced into the reaction chamber 100 is not uniform while performing the desired etching or deposition process. Furthermore, when the pump 150 is operated to maintain the vacuum of the reaction chamber 100, the disturbances in the flow of the reacting gases is even more distinct. Because of the disturbed gas flow, the uniformity and microloading effect of the wafer 120 are seriously affected, which causes a grave decrease in the manufacturing yield the uniformity of the dies in the wafer.

In light of the foregoing, there is a need to provide an installation for the reaction chamber that avoids the drawbacks described above.

SUMMARY OF THE INVENTION

Accordingly, the present invention provides an installation for adjusting gas supply in a semiconductor manufacturing reaction chamber according to environmental conditions in the reaction chamber, by which the gases can be uniformly distributed, and which can maintain the uniformity of the wafer in the following process.

The installation of the present invention for adjusting gas supply in a reaction chamber according to the conditions in the reaction chamber comprises sensors, a gas-supplying panel and a driving device. The sensors are located in the reaction chamber to sense the conditions in the reaction chamber. The gas-supplying panel has a plurality of asymmetrically located apertures through which the gas is supplied. The driving device, coupled to the sensors and the gas-supplying panel, drives the gas-supplying panel to respond to the conditions sensed by the sensors, in which the gas-supplying panel can adjust the positions of the gas supply through the apertures.

To achieve these and other advantages and in accordance with the purpose of the invention, as embodied and broadly described herein, the invention provides an installation for adjusting gas supply in a reaction chamber according to conditions in the reaction chamber. The installation comprises sensors, a gas-supplying panel and a driving device. The sensors are located in the reaction chamber to sense the conditions in the reaction chamber. The gas-supplying panel has a plurality of apertures through which gas is supplied. The driving device, coupled to the sensors and the gas-supplying panel, drives the gas-supplying panel to rotate in response to the conditions sensed by the sensors.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
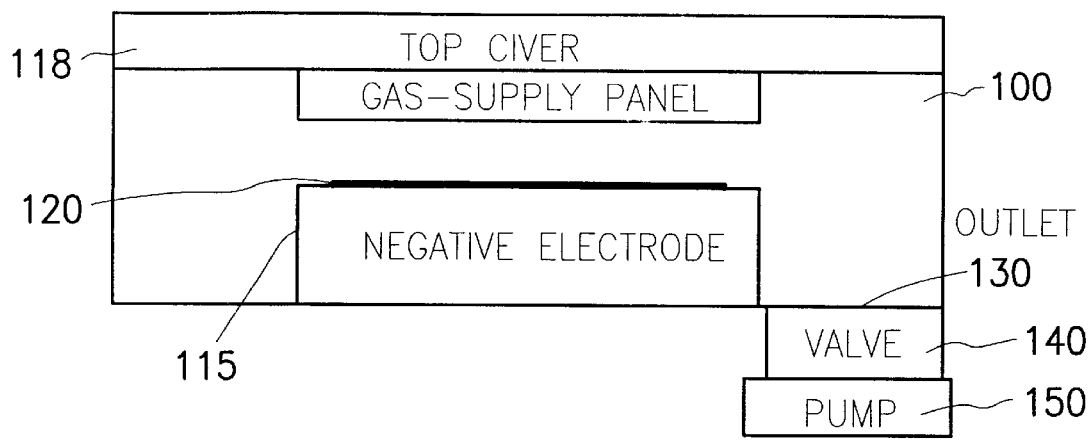
FIG. 1 shows a schematic, cross-sectional view of a conventional installation to supply gas in a reaction chamber while performing a semiconductor manufacturing process.
Figure 2:
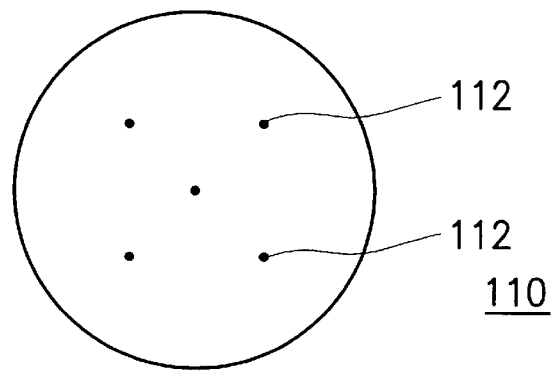
FIG. 2 shows a schematic, top view of the conventional gas-supplying panel shown in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
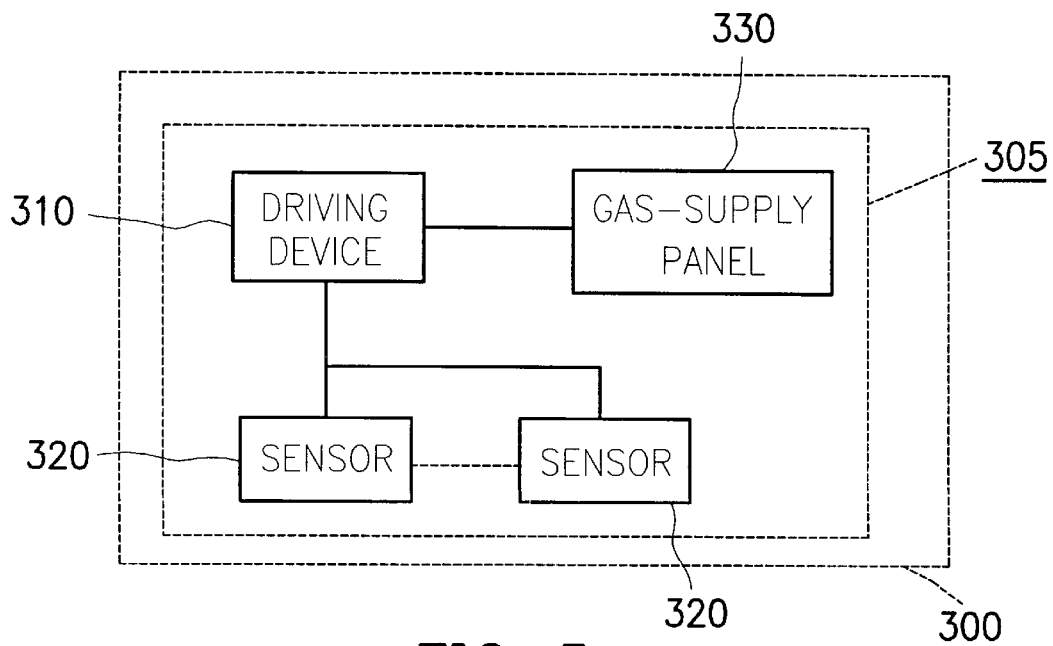
FIG. 3 shows block diagrams of an installation to supply gas in a reaction chamber while performing a semiconductor manufacturing process according to a preferred embodiment of this invention.

FIG. 3 shows block diagrams of an installation 305 to supply gas in a reaction chamber 305 while performing a semiconductor manufacturing process according to a preferred embodiment of this invention. The installation 305 includes a plurality of sensors 320 that can detect conditions in the reaction chamber 305. The conditions include the gas flow of the reacting gases, the pressure, the temperature or the humidity of the reaction chamber 300, for example. The sensor 320 can be a flow meter, a manometer, a thermometer or a hygrometer, depending on the condition desired to be sensed. A flow meter serving as the sensor 320 is later described in detail in one embodiment of the invention.

The installation 305 further includes a driving device 310 coupled to the sensors 320 and a gas-supplying panel 330 coupled to the driving device 310. The gas flow condition in different places in the reaction chamber 300 is detected by the sensors 320 located in these different places and this information can be transmitted to the driving device 310. The driving device 310 can change the way the gas-supplying panel 330 supplies gas, according to the information received from the sensors 320. The driving device 310 can be, for example, a driving motor or some apparatus with a similar function.

The gas-supplying panel 330 includes a plurality of apertures which are not shown in FIG. 3 but are introduced hereinafter in FIG. 5A and FIG. 5B. The gas-supplying panel 330 can be driven by the driving device 310, by which the gas-supplying panel 330 can be, for example, rotated to change the gas flow of the gases introduced through the apertures. The location of the apertures is asymmetrical, by which insufficient gas flow in some places in the reaction chamber 300 absent of enough gas flowing can be enhanced by adjusting the location of the apertures to change the way gases are released. According to the forgoing way, the introduced reacting gases can be distributed uniformly and the gas flow of the gases is steady, by which the wafer is uniformly processed.

Figure 4:
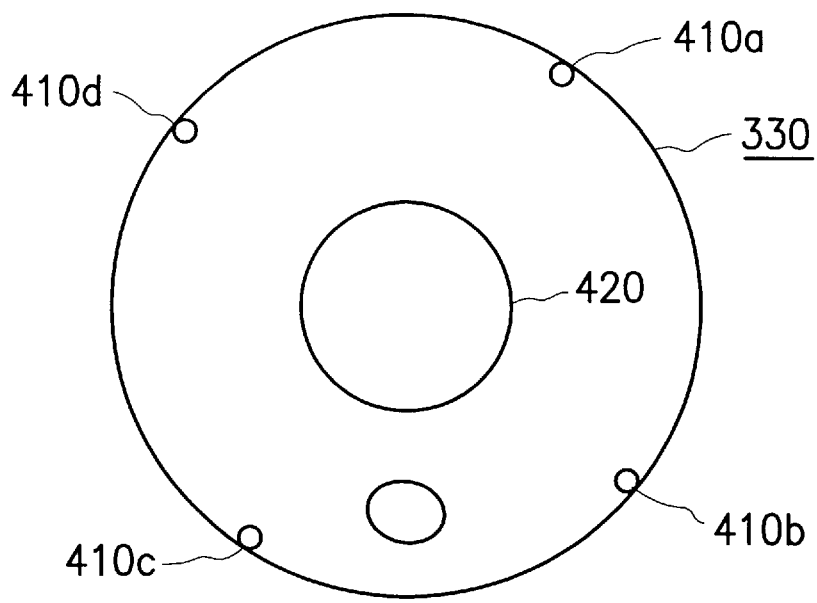
FIG. 4 shows a schematic, top view of portions of the installation to supply gas in the reaction chamber as shown in FIG. 3.

FIG. 4 shows a schematic, top view of portions of the installation 305 to supply gas in the reaction chamber 300 as shown in FIG. 3. As shown in FIG. 4, sensors 410a, 410b, 410c and 410d are located in places close to the center of the reaction chamber 300, by which conditions of gas flows in the four areas corresponding to the sensors 410a, 410b, 410c and 410d can be sensed. The reaction chamber 300 further includes a negative electrode 420 placed in the center of the reaction chamber 300. The wafer (not shown) to be treated can be placed on the negative electrode 420 in the following process.

The gas-supplying panel (not shown) can be placed over the negative electrode 420 and under the top cover of the reaction chamber 300, as shown in the FIG. 1. Compared with the prior art, the invention improves the location of the apertures of the gas-supplying panel, which is described latter.

Figures 5A, 5B:
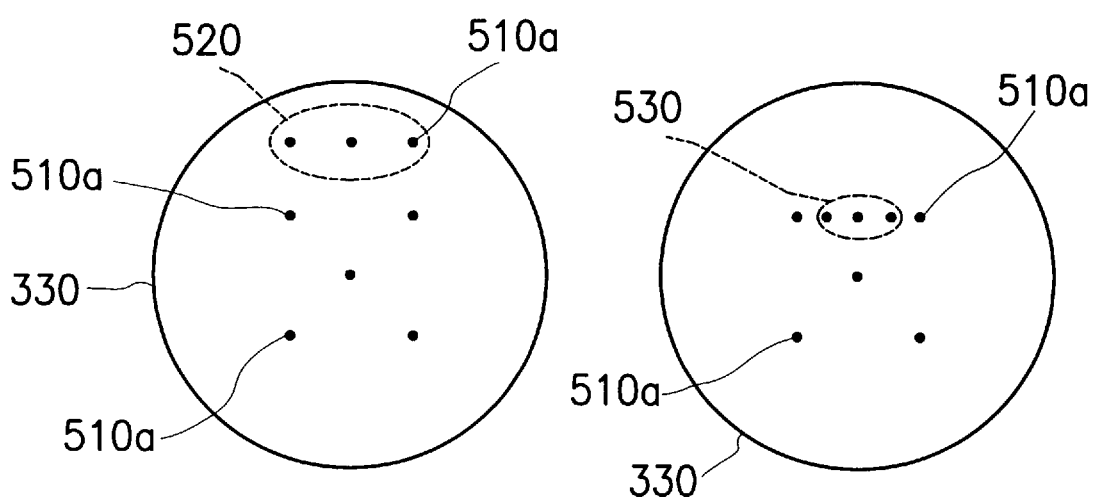
FIG. 5A shows a schematic, top view of a gas-supplying panel installed in the reaction chamber as shown in FIG. 3, according to a preferred embodiment.
FIG. 5B shows a schematic, top view of a gas-supplying panel installed in the reaction chamber as shown in FIG. 3, according to another preferred embodiment.

FIG. 5A shows a schematic, top view of a preferred embodiment of the gas-supplying panel 330 installed in the reaction chamber 300 as shown in FIG. 3. The gas-supplying panel 330 has a plurality of apertures 510a located thereon. The apertures 510a are used to introduce the reacting gases into the reaction chamber 100. An important feature of the invention is that some apertures 510a are added in the area 520 of the gas-supplying panel 330, and that the apertures 510a in the gas-supplying panel 330 are asymmetrically located.

For example, when the driving device 310 shown in FIG. 3 receives information regarding conditions from the sensor 320 shown in FIG. 3, the driving device 310 drives the gas-supplying panel 330 shown in FIG. 3 to response to the sensed conditions. For example, the gas-supplying panel 330 begins to rotate. When reacting gases are perceived to be insufficient in a part of the reaction chamber 300, the driving device 310 drives the gas-supplying panel 330 to rotate to that place, so that the insufficient reacting gas flow can be supplemented with gas from the apertures 510a of the area 520. Addition of apertures 510a is not restricted to the area 520. Referring to FIG. 5B, the added apertures 510a can also be located in the area 530, which is another embodiment of the gas-supplying panel 330 as shown in FIG. 3.

Furthermore, if the gas-supplying panel 330 can rotate rapidly, the gas flow of the whole reaction chamber 330 can be uniform, even without the asymmetrically located apertures. The gas flow of the reacting gases can be uniformly introduced by the gas-supplying panel.

In conclusion, there are many advantages in the invention when comparing it with the conventional gas-supplying panel having symmetrically located apertures, including:

1. Design drawbacks generated by the conventional reaction chamber can be overcome by the invention, by which a stable semiconductor manufacturing process can be acquired.

2. The question concerning non-uniform flow of gases introduced into the reaction chamber, which is due to the asymmetry of the installations in the reaction chamber, can be overcome, which decreases the difference between reaction chambers.

3. The uniformity of the wafer to be treated can be improved tremendously and the microloading effect of the wafer, which limits the coefficients used in the manufacturing process, can be improved to optimize the function of the machine.

4. The time and money spent for improving the gas-supplying panel can be decreased.

5. The gas-supplying panel can be designed to rotate continuously so that it has the same function as the conventional, fixed gas supplying panel having symmetrically placed apertures.

Although the circular gas-supplying panel is introduced as a preferred embodiment in the foregoing, the shape of the gas-supplying panel is not restricted to a circular shape. A gas supplying panel with a different shape and the above-described features will also have the same advantages.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An installation for adjusting gas supply in a reaction chamber according to conditions in the reaction chamber, the installation comprising:

a plurality of sensors, wherein the sensors are located in the reaction chamber to sense the conditions in the reaction chamber;

a gas-supplying panel having a plurality of apertures which are asymmetrically located, wherein gas is supplied through the apertures; and a driving device, coupled to the sensors and the gas-supplying panel, wherein the driving device drives the gas-supplying panel to respond to the conditions sensed by the sensors, whereby the gas-supplying panel can adjust the positions of the gas supplied through the apertures.

2. The installation as claimed in the claim 1, wherein the driving device drives the gas-supplying panel to rotate to response to the conditions sensed by the sensors.

3. The installation as claimed in claim 1, wherein the condition is the temperature of the reaction chamber.

4. The installation as claimed in claim 1, wherein the condition is the gas flow of gases introduced into the reaction chamber.

5. The installation as claimed in claim 1, wherein the sensors are flow meters.

6. The installation as claimed in claim 1, wherein the sensors are manometers.

7. The installation as claimed in claim 1, wherein the sensors are thermometers.

8. The installation as claimed in the claim 1, wherein the sensors are hygrometers.

9. An installation for adjusting gas supply in a reaction chamber according to conditions in the reaction chamber, the installation comprising:

a plurality of sensors, wherein the sensors are located in the reaction chamber to sense the conditions in the reaction chamber;

a gas-supplying panel having a plurality of apertures, wherein gas is supplied through the apertures; and a driving device, coupled to the sensors and the gas-supplying panel, wherein the driving device drives the gas-supplying panel to respond to the conditions sensed by the sensors.

10. An installation for adjusting gas supply in a reaction chamber according to conditions in the reaction chamber, the installation comprising:

a plurality of sensors, wherein the sensors are located in the reaction chamber to sense the conditions in the reaction chamber;

a gas-supplying panel having a plurality of apertures which are asymmetrically located, wherein gas is supplied through the apertures; and a driving device, coupled to the sensors and the gas-supplying panel, wherein the driving device drives the gas-supplying panel to rotate in response to the conditions sensed by the sensors, whereby the gas-supplying panel can adjust the positions of the gas supplied through the apertures.

* * * * *